(12) United States Patent
Lee

(10) Patent No.: US 7,358,138 B2
(45) Date of Patent: Apr. 15, 2008

(54) METHOD OF MANUFACTURING FLASH MEMORY DEVICE

(75) Inventor: Hee Gee Lee, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 167 days.

(21) Appl. No.: 11/379,738

(22) Filed: Apr. 21, 2006

(65) Prior Publication Data

US 2006/0237772 A1    Oct. 26, 2006

(30) Foreign Application Priority Data

Apr. 22, 2005  (KR) ...................... 10-2005-0033708
Apr. 17, 2006  (KR) ...................... 10-2006-0034509

(51) Int. Cl.
*H01L 21/336*  (2006.01)

(52) U.S. Cl. ...................... 438/264; 257/314

(58) Field of Classification Search ............... 438/702, 438/268, 264; 257/317, 315

See application file for complete search history.

(56) References Cited

U.S. PATENT DOCUMENTS 7,110,299 B2    9/2006  Forbes

2006/0008993 A1 *   1/2006  Song et al. ................. 438/268
2006/0163646 A1 *   7/2006  Black et al. ................ 257/316

* cited by examiner

*Primary Examiner*—Mark A. Robinson
*Assistant Examiner*—Tifney L Skyles
(74) *Attorney, Agent, or Firm*—Townsend and Townsend and Crew LLP

(57) ABSTRACT

An embodiment of the present invention relates to a method of manufacturing a flash memory device. The method includes sequentially forming a tunnel oxide film, an oxide film, and a first conductive layer on a semiconductor substrate, infiltrating a first etchant between grains of the first conductive layer to form a plurality of nano-crystal points in the oxide film, removing the first conductive layer using a second etchant, wherein during the process of removing the first conductive layer, portions of the nano-crystal points of the oxide film are removed by the second etchant, thereby forming a plurality of nano-crystal formation holes in the oxide film, filling the plurality of holes with a non-conductive layer to form a plurality of nano-crystals respectively having an isolated shape, sequentially forming a dielectric layer and a second conductive layer on the oxide film including the plurality of nano-crystals, and sequentially patterning the second conductive layer, the dielectric layer, the oxide film including the nano-crystals, and the tunnel oxide film.

6 Claims, 2 Drawing Sheets

METHOD OF MANUFACTURING FLASH MEMORY DEVICE

BACKGROUND

The present invention relates to a method of manufacturing semiconductor devices. More particularly, the present invention relates to a method of manufacturing flash memory devices.

Non-volatile memory devices are configured to store information even when they are not applied with power unlike volatile memory devices. Accordingly, the non-volatile memory devices such as flash memory devices have been widely used in a file system, a memory card, a portable device, and so on.

The non-volatile memory device has a stack gate structure in which the tunnel oxide film, the floating gate, the dielectric film and the control gate electrode are sequentially stacked on the channel region of the semiconductor substrate.

The non-volatile memory cell with the stack gate structure can be programmed by implanting hot electrons. In other words, a high voltage is applied to the control gate and a potential difference is created between the source and drain regions. As a result, hot electrons are generated in the channel region near the drain. These hot electrons acquire sufficient energy to overcome the energy barrier of the tunnel oxide film and are injected into the floating gate. If the electrons are injected into the floating gate, the threshold voltage of the transistor (or memory cell) is increased. If a voltage applied to the control gate is less than the increased threshold voltage, the transistor remained turned-off and current does not flow through the cell. The above process is used to store and read information from the non-volatile device.

Information stored in the non-volatile memory cell having the stack gate structure can be erased by discharging the electrons that have been injected into the floating gate by F-N tunneling phenomenon. In other words, the source region is applied with a high voltage, the control gate electrode and the substrate are applied with 0V, and the drain is floated. Consequently, a strong electric field is generated between the source region and the floating gate, thereby causing the F-N tunneling to occur.

Since the floating gate is formed using a conductive film, almost all of the electrons injected into the floating gate can be removed near the source region by the F-N tunneling during the erase operation.

However, the non-volatile memory cell having the stack gate electrode structure may have a problem related to electron maintenance. In other words, in order for the non-volatile memory cell to maintain the programmed information, the non-volatile memory cell must maintain electrons injected into the floating gate electrode. If defects such as pin holes exist in the tunnel oxide film, however, the electrons injected into the floating gate electrode may exit through the defects. Since the floating gate is formed of the conductive film, a significant leakage current is generated by the defects in the tunnel dielectric film.

In addition, too many electrons may be discharged from the floating gate during the erase operation since the floating gate is formed of the conductive film and the electrons move freely therein.

SUMMARY OF THE INVENTION

A method of manufacturing a flash memory device according to an embodiment of the present invention includes the steps of sequentially forming a tunnel oxide film, an oxide film, and a first conductive layer on a semiconductor substrate, infiltrating a first etchant between grains of the first conductive layer to form a plurality of nano-crystal points in the oxide film, removing the first conductive layer using a second etchant, wherein during the process of removing the first conductive layer, portions of the nano-crystal points of the oxide film are removed by the second etchant, thereby forming a plurality of nano-crystal formation holes in the oxide film, filling the plurality of holes with a non-conductive layer to form a plurality of nano-crystals respectively having an isolated shape, sequentially forming a dielectric layer and a second conductive layer on the oxide film including the plurality of nano-crystals, and sequentially patterning the second conductive layer, the dielectric layer, the oxide film including the nano-crystals, and the tunnel oxide film.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

Figure 1:
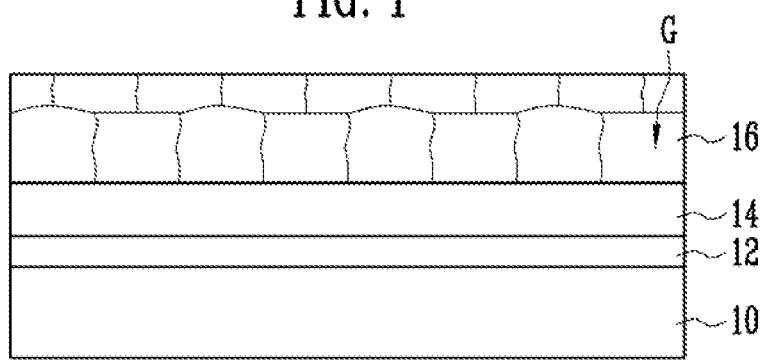
FIGS. 1 to. 7 are cross-sectional views illustrating a method of manufacturing a flash memory device according to an embodiment of the present invention.

In the following detailed description, only a certain exemplary embodiment of the present invention has been shown and described simply by way of illustration. As those skilled in the art will realize, the described embodiment may be modified in various different ways, without departing from the spirit or scope of the present invention. Accordingly, the drawings and description are to be regarded as illustrative in nature and not restrictive. Like reference numerals designate like elements throughout the application.

FIGS. 1 to. 7 are cross-sectional views illustrating a method of manufacturing a flash memory device according to an embodiment of the present invention.

As shown in FIG. 1, a tunnel oxide film 12, an oxide film 14, and a first conductive film 16 having grains G are sequentially formed on a semiconductor substrate 10. The first conductive layer 16 may be formed of polysilicon.

Figure 2:
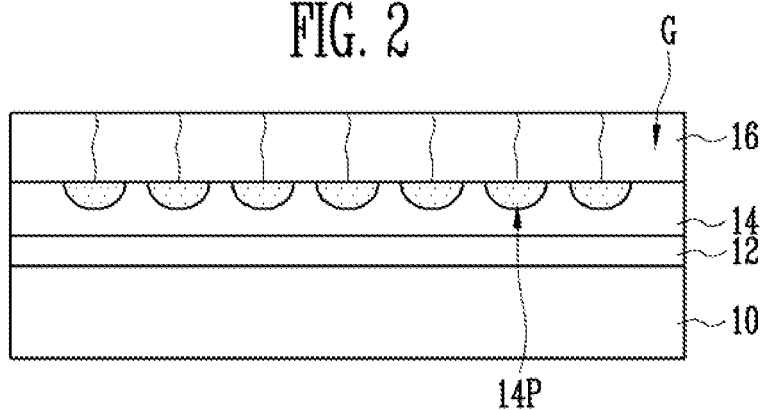

Referring to FIG. 2, an etch-back process or a wet dip process using a first etchant is performed on the first conductive layer 16, so that the first etchant is infiltrated between the grains G of the first conductive layer 16. Accordingly, a plurality of nano-crystal points 14P are formed within the oxide film 14. During the etch-back process or the wet dip process, the first conductive layer 16 is etched at a given thickness and becomes smooth accordingly. The first etchant may be an etchant including HF.

Figure 3:
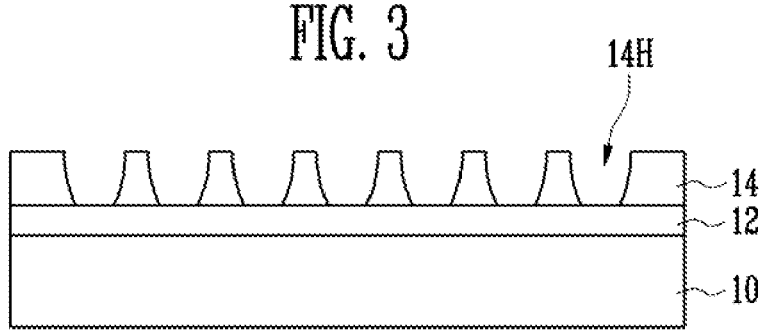

Referring to FIG. 3, the first conductive layer 16 is removed using a second etchant. While the first conductive layer 16 is removed, the second etchant continues to infiltrate between the grains G of the first conductive layer 16. Accordingly, the portions of the nano-crystal points 14P are extended and are then removed by the second etchant as a top surface of the oxide film 14 is exposed, thereby forming a plurality of nano-crystal formation holes 14H within the oxide film 14. The second etchant may be an etchant including HF. The nano-crystal points 14P are rapidly removed since the first and second etchant have been infiltrated, but portions of the oxide film 14 into which the first and second etchants have not been infiltrated remain intact without being removed.

Figure 4:
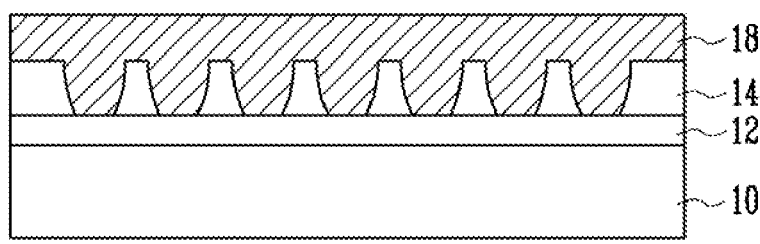

Referring to FIG. 4, a non-conductive layer 18 is formed on the oxide film 14 in which the hole 14H are formed. The non-conductive layer 18 may be formed using a non-conductive material such as undoped polysilicon or nitride.

Figure 5:
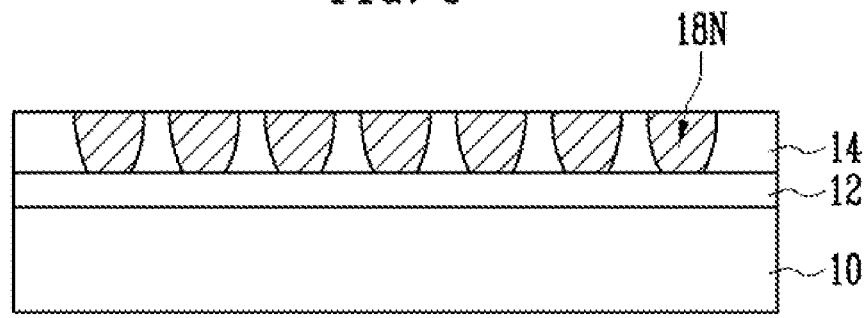

Referring to FIG. 5, the non-conductive layer 18 is removed by a chemical mechanical polishing (CMP) until the top surface of the oxide film 14 is exposed. Accordingly, the plurality of holes 14H are filled with the non-conductive layer 18, forming a plurality of nano-crystals 18N respectively having an isolated shape. The nano-crystals 18N serve as floating gates.

Figure 6:
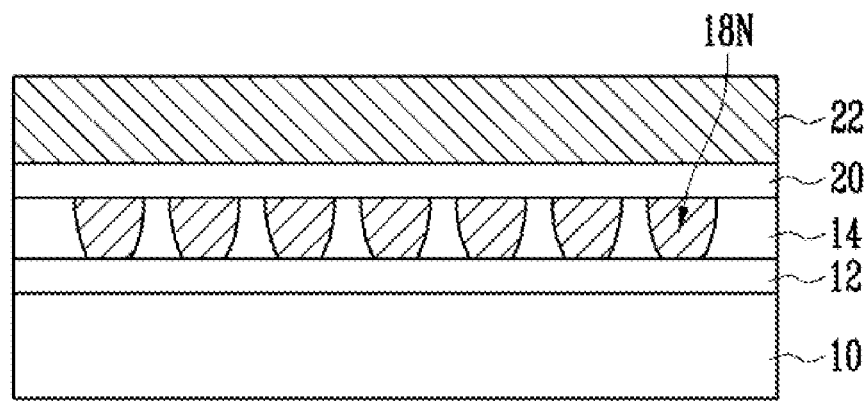

Referring to FIG. 6, a dielectric layer 20 and a second conductive layer 22 are sequentially formed on the oxide film 14 including the plurality of nano-crystals 18N. The second conductive layer 22 may be formed using a material for forming a control gate.

Figure 7:
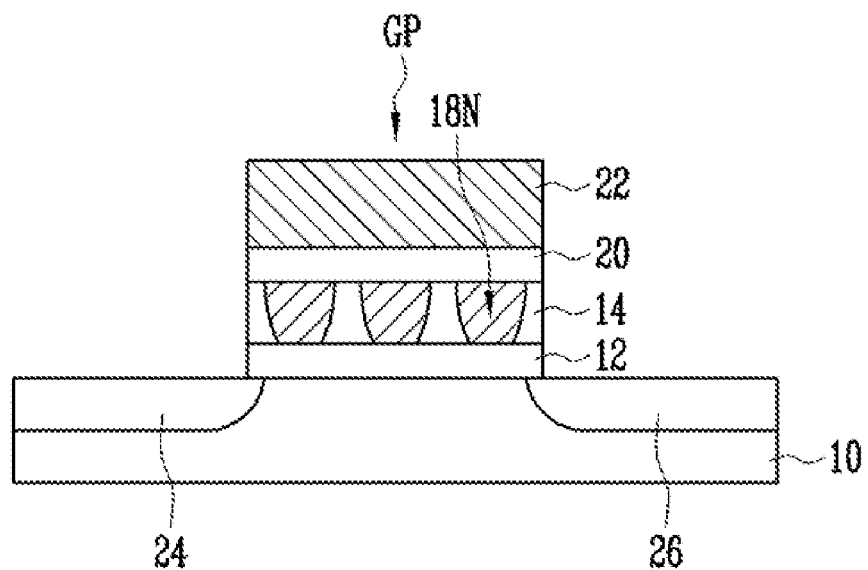

Referring to FIG. 7, the second conductive layer 22, the dielectric layer 20, the oxide film 14 including the nano-crystals 18N, and the tunnel oxide film 12 are sequentially patterned to form a gate electrode pattern GP. A source/drain ion implant process is performed to form a source region 24 and a drain region 26 in the semiconductor substrate 10.

Hereinafter, the program, read and erase operations of the non-volatile memory cell according to an embodiment of the present invention will be described.

The program operation of first type may be performed by applying voltages to the control gate electrode 22 and the source region 24 and grounding the drain region 26. Hot electrons are generated near the source region 24 accordingly.

The hot electrons acquire sufficient energy to overcome the energy barrier of the tunnel oxide film 12 and then are injected into the plurality of nano-crystals 18N near the source region 24. As the hot electrons are injected into these nano-crystals 18N, the threshold voltage (Vth) of the non-volatile memory cell is increased. This increase in the threshold voltage can be used to store information in the non-volatile memory cell. Since the nano-crystals 18N are spaced apart from each other by the oxide film 14 and the dielectric layer 20, the electrons injected into a given nano-crystal 18N cannot easily move into the other nano-crystals 18N.

In the present embodiment, the nano-crystals 18N are formed using a non-conductive material. Accordingly, the leakage current can be prevented even though defects exist in the tunnel oxide film 12 or the dielectric layer 20 near the nano-crystals 18N.

In addition to the above, the present device may be programmed using a program operation of second type that involves grounding the source region 24 and the drain region 26 and applying voltages to the control gate electrode 22 and the semiconductor substrate 10, so that the F-N tunneling effect is induced. At this time, electrons are uniformly injected into the nano-crystals 18N by the F-N tunneling effect. Since the nano-crystals 18N are provided in the oxide film 14, the leakage current can be prevented even if defects exist in the tunnel oxide film 12 or the control gate electrode 22.

The read operation may be performed by applying voltages to the control gate electrode 22 and the drain region 26 and grounding the source region 24. If the hot electrons have been injected into the nano-crystals 18N, the gate voltage (Vg) applied to the control gate electrode 22 may be lower than the threshold voltage of the transistor (or memory cell). If so, a channel current does not flow through the cell in which the hot electrons have been injected into the nano-crystals 18N. This state is interpreted as the binary state "0" in the present embodiment.

However, if the cell does not have a significant number of hot electrons that have been injected in the nano-crystals 18N, the cell or transistor is turned-on since its initial threshold voltage has remained unchanged and the applied gate voltage (Vg) would be higher than the initial threshold voltage. A current flows through the cell accordingly. This state is interpreted as the binary state "1" in the present embodiment.

The erase operation may be performed employing the hot hole injection. In other words, a negative voltage is applied to the control gate electrode 22 to generate hot holes near the source region 24. The voltage applied to the control gate electrode 22 pulls the hot holes over the energy barrier of the tunnel oxide film 12 and causes the holes to be injected into the nano-crystals 18N near the source region 24. The hot holes injected into the nano-crystals 18N combines with the hot electrons that have been previously injected into the nano-crystals 18N.

The nano-crystals 18N are spaced apart from each other and are formed of a non-conductive material, thereby minimizing the possibility of excessive erase. In addition, during the program operation of first type, the hot electrons are injected into the nano-crystals 18N near the source region 24 and are kept there. Accordingly, the erase operation employing the hot hole injection can be performed on the nano-crystals 18N near the source region.

On the other hand, in the case where the electrons are uniformly injected into the nano-crystals 18N by F-N tunneling (i.e., the program operation of second type), the erase operation may be performed employing the F-N tunneling. In other words, a negative voltage is applied to the control gate electrode 22 and a positive voltage is applied to the semiconductor substrate 10. Accordingly, the electrons injected into the nano-crystals 18N are erased by discharging the electrons in the nano-crystals 18N.

As described above, in accordance with an embodiment of the present invention, nano crystals are adopted to hold electrons. Accordingly, the leakage current by defects occurring in the tunnel oxide film or the dielectric layer can be prevented or minimized. It is also possible to minimize the occurrence of excessive erase during the erase operation.

While the invention has been described in connection with what is presently considered to be an exemplary embodiment, it is to be understood that the invention is not limited to the disclosed embodiment, but, on the contrary, is intended to cover various modifications and equivalent arrangements included within the spirit and scope of the appended claims.

What is claimed is:

1. A method of manufacturing a flash memory device, the method comprising the steps of:

sequentially forming a tunnel oxide film, an oxide film, and a first conductive layer on a semiconductor substrate;

infiltrating a first etchant between grains of the first conductive layer to form a plurality of nano-crystal points in the oxide film;

removing the first conductive layer using a second etchant, wherein during the process of removing the first conductive layer, portions of the nano-crystal points of the oxide film are removed by the second etchant, thereby forming a plurality of nano-crystals formation holes in the oxide film;

filling the plurality of holes with a non-conductive layer to form a plurality of nano-crystals respectively having an isolated shape;

sequentially forming a dielectric layer and a second conductive layer on the oxide film including the plurality of nano-crystals; and sequentially patterning the second conductive layer, the dielectric layer, the oxide film including the nano-crystals, and the tunnel oxide film.

2. The method of claim 1, wherein the first conductive layer is formed of polysilicon.

3. The method of claim 1, wherein the first and second etchants are etchants containing HF.

4. The method of claim 1, wherein the plurality of nano-crystal points are formed by allowing the first etchant to be infiltrated between the grains of the first conductive layer by means of an etch-back process or a wet dip process using the first etchant.

5. The method of claim 1, wherein the plurality of nano-crystals are formed by forming the non-conductive layer on the oxide film, and performing a CMP on the non-conductive layer until a top surface of the oxide film is exposed, whereby the plurality of holes are filled with the non-conductive layer.

6. The method of claim 1, wherein the non-conductive layer is formed using undoped polysilicon or nitride.

* * * * *